(12) United States Patent
Noy et al.

(10) Patent No.: US 12,103,276 B2
(45) Date of Patent: Oct. 1, 2024

(54) PATTERN TRANSFER SHEET, METHOD OF MONITORING PATTERN TRANSFER PRINTING, AND PATTERN TRANSFER PRINTING SYSTEM

(71) Applicant: Wuhan Dr Laser Technology Corp., Ltd., Wuhan (CN)

(72) Inventors: Amir Noy, Kfar Mordechai (IL); Benny Naveh, Givat Shmuel (IL); Eyal Cohen, Kfar-Saba (IL); Valery Sorin, Jerusalem (IL); Dor Dror, Ganei Tikva (IL)

(73) Assignee: Wuhan DR Laser Technology Corp, . LTD, Wuhan (CN)

( * ) Notice: Subject to any disclaimer, the term of this patent is extended or adjusted under 35 U.S.C. 154(b) by 183 days.

(21) Appl. No.: 17/864,419

(22) Filed: Jul. 14, 2022

(65) Prior Publication Data

US 2023/0019668 A1    Jan. 19, 2023

(30) Foreign Application Priority Data

Jul. 15, 2021 (CN) .......................... 202110802980.7
Jul. 15, 2021 (CN) .......................... 202121615187.8
(Continued)

(51) Int. Cl.
*B32B 27/00* (2006.01)
*B32B 3/30* (2006.01)
(Continued)

(52) U.S. Cl.
CPC ................ *B32B 27/08* (2013.01); *B32B 3/30* (2013.01); *B32B 7/027* (2019.01);
(Continued)

(58) Field of Classification Search
CPC ........... B32B 27/08; B32B 3/30; B32B 7/027; B32B 2250/02; B32B 2250/24; B32B 2307/412; B32B 2307/7376
(Continued)

(56) References Cited

U.S. PATENT DOCUMENTS 9,616,524 B2    4/2017    Matusovsky et al.
10,973,129 B2   4/2021    Landa et al.
(Continued)

FOREIGN PATENT DOCUMENTS

AU    2019/200576    2/2019
CN    104647885      5/2013
(Continued)

OTHER PUBLICATIONS

Search Report dated Dec. 16, 2022 for European Application No. EP22183297.5, 8 pages.
(Continued)

*Primary Examiner* — Betelhem Shewareged
(74) *Attorney, Agent, or Firm* — PEARL COHEN ZEDEK LATZER BARATZ LLP (57) ABSTRACT

Pattern transfer sheets, methods of monitoring pattern transfer printing, and pattern transfer printing systems are provided, for monitoring and adjusting laser illumination used for transferring paste patterns from trenches on the sheets onto a substrate such as electronic circuitry and/or solar cell substrates. Pattern transfer sheets comprise, outside the pattern, (i) trace mark(s) configured to receive the printing paste, aligned to the trenches and are wider than the width of the illuminating laser beam—to detect misalignment of paste release from within the trace mark(s) and/or (ii) working window marks configured to receive the printing paste, set at specified offsets with respect to specific trenches, with different working window marks set at different (Continued)

ferent offsets—to correct the effective working window by adjusting the power of the laser beam.

14 Claims, 6 Drawing Sheets

(30) Foreign Application Priority Data

Sep. 3, 2021 (CN) .......................... 202111034191.X
Sep. 3, 2021 (CN) .......................... 202122130645.5

(51) Int. Cl.
*B32B 27/08* (2006.01)
*B32B 7/027* (2019.01)

(52) U.S. Cl.
CPC ....... *B32B 2250/02* (2013.01); *B32B 2250/24* (2013.01); *B32B 2307/412* (2013.01); *B32B 2307/7376* (2023.05)

(58) Field of Classification Search
USPC ....................................... 428/32.6
See application file for complete search history.

(56) References Cited

U.S. PATENT DOCUMENTS

| | | | |
|---|---|---|---|
| 2004/0110321 A1* | 6/2004 | Oda | H05K 3/207 |
| | | | 438/622 |
| 2009/0074987 A1 | 3/2009 | Auyeung et al. | |
| 2011/0090564 A1 | 4/2011 | Utsuro | |
| 2011/0097550 A1 | 4/2011 | Matusovsky et al. | |
| 2017/0013724 A1 | 1/2017 | Noy | |
| 2018/0243871 A1 | 8/2018 | Kokubo et al. | |
| 2019/0019736 A1 | 1/2019 | Schrauben et al. | |
| 2020/0211729 A1* | 7/2020 | Chandrasekaran | H01L 31/022425 |
| 2021/0136923 A1 | 5/2021 | Landa | |
| 2022/0314598 A1 | 10/2022 | Gong et al. | |
| 2023/0019668 A1* | 1/2023 | Noy | G03F 9/7038 |

FOREIGN PATENT DOCUMENTS

| | | |
|---|---|---|
| CN | 103129186 | 6/2013 |
| CN | 103730542 | 1/2016 |
| CN | 111761840 | 10/2020 |
| CN | 216069167 U | 3/2022 |
| CN | 216139714 U | 3/2022 |
| CN | 115489196 | 12/2022 |
| CN | 115610127 | 1/2023 |
| DE | 19746174 | 7/1999 |
| EP | 2660352 | 11/2013 |
| JP | H0716935 | 7/1995 |
| WO | WO 2005/040929 | 5/2005 |
| WO | WO 2007/096746 | 8/2007 |
| WO | WO 2009/143792 | 12/2009 |
| WO | WO 2013/180370 | 12/2013 |
| WO | WO 2015/128857 | 9/2016 |
| WO | WO 2018/020479 | 2/2018 |
| WO | WO-2018/020481 A1 | 2/2018 |
| WO | WO-2018/020483 A1 | 2/2018 |
| WO | WO 2020/187453 | 9/2020 |

OTHER PUBLICATIONS

Luque and Hegedus (eds.) 2011, Handbook of photovoltaic science and engineering, pp. 276-277, https://kashanu.ac.ir/Files/Content/Handbook.pdf, Total pp. 117.

Lossen et al. (2015), Pattern Transfer Printing (PTP™) for c-Si solar cell metallization, 5$^{th}$ Workshop on Metallization for Crystalline Silicon Solar Cells, Energy Procedia 67:156-162.

* cited by examiner

PATTERN TRANSFER SHEET, METHOD OF MONITORING PATTERN TRANSFER PRINTING, AND PATTERN TRANSFER PRINTING SYSTEM

CROSS-REFERENCE TO RELATED APPLICATIONS

This application is claiming priority from Chinese Application Number 2021108029807 filed on Jul. 15, 2021, and Chinese Utility Model Application Number 2021216151878 filed on Jul. 15, 2021, and Chinese Application Number 202111034191X filed on Sep. 3, 2021, and Chinese Utility Model Application Number 2021221306455 filed on Sep. 3, 2021, which are hereby incorporated by reference.

BACKGROUND OF THE INVENTION

Technical Field

The present invention relates to the field of transfer printing, and more particularly, to control of illumination alignment and process control of transfer printing.

Discussion of Related Art

U.S. Pat. No. 9,616,524, which is incorporated herein by reference in its entirety, teaches a method of depositing a material on a receiving substrate, the method comprising: providing a source substrate having a back surface and a front surface, the back surface carrying at least one piece of coating material; providing a receiving substrate positioned adjacent to the source substrate and facing the coating material; and radiating light towards the front surface of the source substrate, to remove at least one piece of the coating material from the source substrate and deposit said removed at least one piece onto the receiving substrate as a whole.

Lossen et al. (2015), Pattern Transfer Printing (PTP™) for c-Si solar cell metallization, 5$^{th}$ Workshop on Metallization for Crystalline Silicon Solar Cells, Energy Procedia 67:156-162, which is incorporated herein by reference in its entirety, teaches pattern transfer printing (PTP™) as a non-contact printing technology for advanced front side metallization of c-Si PV solar cells, which is based on laser-induced deposition from a polymer substrate.

SUMMARY OF THE INVENTION

The following is a simplified summary providing an initial understanding of the invention. The summary does not necessarily identify key elements nor limit the scope of the invention, but merely serves as an introduction to the following description.

One aspect of the present invention provides a pattern transfer sheet comprising: a plurality of trenches arranged in a specified pattern and configured to receive printing paste and release the printing paste from the trenches upon illumination by a laser beam onto a receiving substrate, and at least one trace mark that is located outside the specified pattern and is configured to receive the printing paste, wherein the at least one trace mark is aligned with respect to at least one of the trenches and is wider than a width of the laser beam.

One aspect of the present invention provides a pattern transfer sheet comprising: a plurality of trenches arranged in a specified pattern and configured to receive printing paste and release the printing paste from the trenches upon illumination by a laser beam onto a receiving substrate, and a plurality of working window marks that are located outside the specified pattern and are configured to receive the printing paste, wherein the working window marks are set at specified offsets with respect to specified trenches of the specified pattern, and wherein different working window marks are set at different offsets.

One aspect of the present invention provides a pattern transfer sheet that is transparent to laser illumination and comprises a plurality of trenches arranged in a specified pattern and configured to receive printing paste and release the printing paste by laser beam illumination onto a receiving substrate, characterized in that the pattern transfer sheet comprises at least one polymer layer, and at least one trace mark set on the polymer layer.

One aspect of the present invention provides a method of monitoring pattern transfer printing using a pattern transfer sheet comprising a plurality of trenches arranged in a specified pattern and configured to receive printing paste and release the printing paste from the trenches onto a receiving substrate upon illumination by a laser beam, the method comprising (i) adding to the pattern transfer sheet at least one trace mark that is located outside the specified pattern and is configured to receive the printing paste, wherein the at least one trace mark is aligned with respect to at least one of the trenches and is wider than a width of the laser beam, and calculating misalignment of the laser beam according to at least one trace thereof in the at least one trace mark after the pattern transfer and correcting the calculated misalignment of the laser beam by adjusting a positioning of the laser beam; and/or (ii) adding to the pattern transfer sheet a plurality of working window marks that are located outside the specified pattern and are configured to receive the printing paste, wherein the working window marks are set at specified offsets with respect to specified trenches of the specified pattern, and wherein different working window marks are set at different offsets, and calculating an effective working window of the laser beam according to transferred working window marks after the pattern transfer and correcting the effective working window by adjusting a power of the laser beam.

One aspect of the present invention provides a pattern transfer printing system comprising: at least one laser scanner configured to illuminate with at least one laser beam a pattern transfer sheet that comprises a plurality of trenches arranged in a specified pattern and holding printing paste, wherein the pattern transfer sheet is configured to release the printing paste from the trenches and onto a receiving substrate upon the illumination by the laser beam, at least one imaging unit configured to monitor at least a part of the pattern transfer sheet during and/or after the release of the printing paste, and a controller configured to adjust the laser beam illumination according to the monitoring by the at least one imaging unit, wherein: the pattern transfer sheet comprises at least one of: (i) at least one trace mark that is located outside the specified pattern and is configured to receive the printing paste, wherein the at least one trace mark is aligned with respect to at least one of the trenches and is wider than a width of the laser beam, and (ii) a plurality of working window marks that are located outside the specified pattern and are configured to receive the printing paste, wherein the working window marks are set at specified offsets with respect to specified trenches of the specified pattern and wherein different working window marks are set at different offsets; and the controller is configured to respectively carry out at least one of: (i) calculate a misalignment of the laser beam according to at least one trace thereof in the at least one trace mark after the pattern transfer and correct the calculated misalignment of the laser beam by adjusting a positioning of the laser beam, and (ii) calculate an effective working window of the laser beam according to transferred working window marks after the pattern transfer and correct the effective working window by adjusting a power of the laser beam.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein are for the purpose of description and should not be regarded as limiting.

Embodiments of the present invention provide efficient and economical methods and mechanisms for controlling transfer printing process and thereby provide improvements to the technological field of producing electric circuits. Diagnostic patterns are provided on dedicated donor substrate used as pattern transfer sheet. The diagnostic patterns are configured to assist in evaluation of systems and methods of pattern transfer printing (PTP) and for PTP process control, to monitor and improve the quality of the transferred pattern. The patterns on the donor substrate (e.g., tape or sheet) include features that are transferred to (e.g., deposited or printed on) receiving structures or patterns (e.g., metal lines on photovoltaic cells or other circuit boards). For example, the transfer of features may be carried out using laser illumination that separates the feature material (e.g., metallic high viscosity paste) from the donor substrate and promotes deposition of the separated material onto the receiving structures. The patterns on the donor substrate further include additional features and/or marks, which lie outside the transferred pattern, and are used for real-time control of the printing process, and especially of the position and power of the illuminating laser beam—in order to maximize or optimize the quality of the printed pattern.

The pattern transfer process is typically carried out by PTP systems and methods which utilize imaging to monitor and control the pattern deposition, e.g., by monitoring the basic laser scanner alignment to the transfer pattern sheet (also termed donor substrate pattern). The detection of the additional features and/or marks may be carried out by the same imaging means such as cameras (or possibly auxiliary imaging means) and respective algorithms and software running on the system computer. Typically, paste remaining on the pattern transfer sheet is detected optically and used to assess possible laser misalignment.

Pattern transfer sheets and related systems and methods are provided, for monitoring and adjusting laser illumination used for transferring paste patterns from trenches on the sheets onto a substrate such as electronic circuitry and/or solar cell substrates. Pattern transfer sheets comprise, outside the pattern, (i) trace mark(s) configured to receive the printing paste, aligned to the trenches and are wider than the width of the illuminating laser beam—to detect misalignment of paste release from within the trace mark(s) and/or (ii) working window marks configured to receive the printing paste, set at specified offsets with respect to specific trenches, with different working window marks set at different offsets—to correct the effective working window by adjusting the power of the laser beam.

Figure 1A:
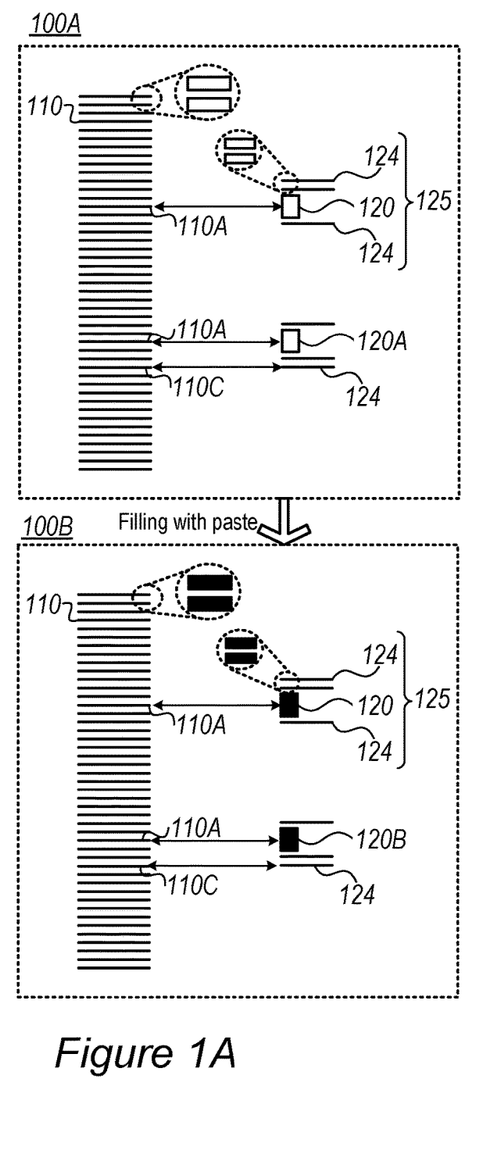
FIGS. 1A and 1B are high-level schematic illustrations of sections of pattern transfer sheets, according to some embodiments of the invention.
Figure 1B:
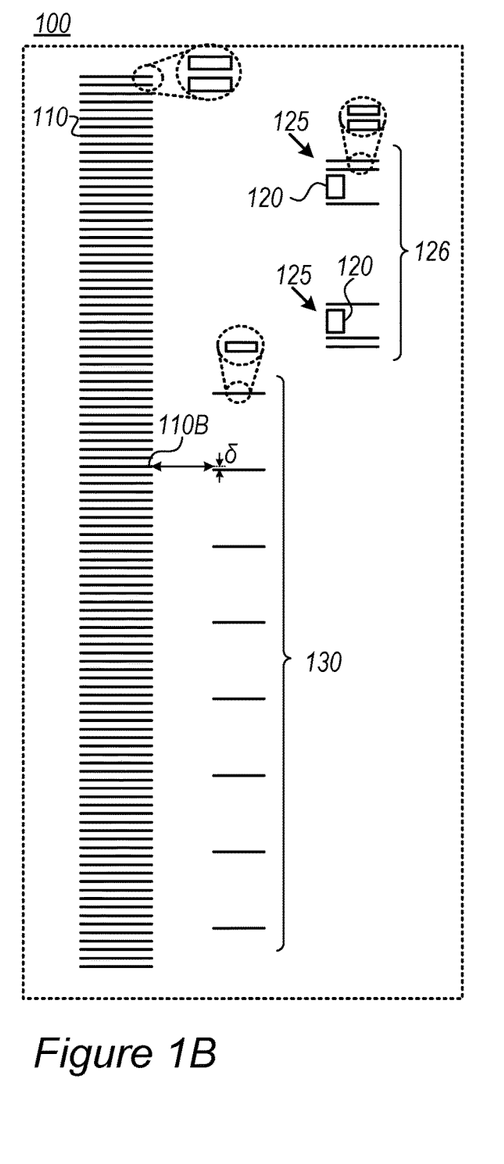

FIGS. 1A and 1B are high-level schematic illustrations of sections of pattern transfer sheets 100, according to some embodiments of the invention. The sections, delineated by dotted lines, illustrate patterning principles and are not limiting with respect to the arrangement, relative positions and dimensions of the illustrated elements.

Figure 5A:
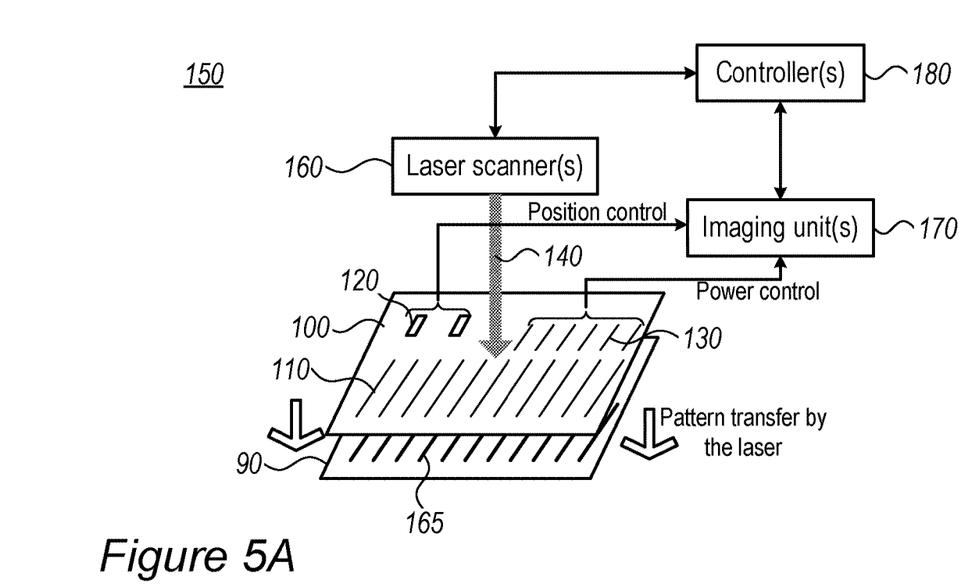
FIG. 5A is a high-level schematic illustration of a PTP system, according to some embodiments of the invention.

Pattern transfer sheet 100 comprises a plurality of trenches 110 arranged in a specified pattern and configured to receive printing paste and release the printing paste from trenches 110 upon illumination by laser (see, e.g., a schematic illustration of a PTP system 150 in FIG. 5A) onto a receiving substrate (see, e.g., substrate 90 in FIG. 5A). FIG. 1A schematically illustrates the filling of trenches 110 on an empty pattern transfer sheet 100A with paste to yield filled pattern transfer sheet 100B, as indicated schematically in the enlarged sections of pattern transfer sheet 100. In FIG. 1B all trenches 110 are illustrated as being empty, prior to the step of paste filling.

Pattern transfer sheet 100 may further comprise at least one trace mark 120 that is located outside the specified pattern of trenches 110 and is configured to receive the printing paste. Trace mark(s) 120 is aligned with respect to respective trench(es) 110A as illustrated schematically in FIG. 1A, and is wider than a width of the laser beam (see, e.g., FIGS. 2A and 2B). Upon illumination by the laser beam, only a part of the paste in trace mark(s) 120 is printed (deposited, released off pattern transfer sheet 100), because the width of trace mark(s) 120 is larger than the width of the laser beam—yielding a gap that may be used to detect the position of the laser beam, as explained below.

Pattern transfer sheet 100 may further comprise a plurality of working window marks 130 that are located outside the specified pattern of trenches 110 and are configured to receive the printing paste. Working window marks 130 are set at specified offsets (indicated schematically by δ) with respect to specified trenches 110B of the specified pattern, with different working window marks 130 being set at different offsets δ, as further illustrated in FIGS. 3 and 4. Working window marks 130 may be used to monitor the power of the laser beam, as explained below.

In certain embodiments, pattern transfer sheet 100 may comprise both trace mark(s) 120 and working window marks 130. Trace mark(s) 120 and working window marks 130 are configured to enable unambiguous detection by image processing (e.g., by imaging unit(s) 170 illustrated schematically in FIG. 5A).

Pattern transfer sheet 100 may further comprise a plurality of alignment marks 124 that are located outside the specified pattern of trenches 110 and are configured to receive the printing paste. Alignment marks 124 may be aligned with respective trenches 110C and be used to provide initial laser scanner alignment with respect to the specified pattern of trenches 110. Alignment marks 124 may be arranged in an asymmetric pattern to enable identification of specific trenches 110C from a partial image of pattern transfer sheet 100. In certain embodiments, alignment marks 124 may be positioned adjacent to trace mark(s) 120 to form a compound mark 125 that may be used for initial scanner alignment (via alignment marks 124) and for laser alignment during printing (via trace mark 120). Compound mark 125 may be configured asymmetrically (e.g., with one alignment mark 124 on one side of trace mark 120 and two alignment marks 124 on the other side of trace mark 120 (as illustrated schematically), to enhance the alignment accuracy. In various embodiments, one or more trace mark 120 may be set adjacent to various configurations of alignment marks 124 to form compound marks 125. In certain embodiments, one or more compound marks 125 may be set adjacently, possibly with minor-imaged asymmetric arrangements of alignment marks 124, e.g., as illustrated schematically in FIG. 1B as compound mark 126.

Figure 2A:
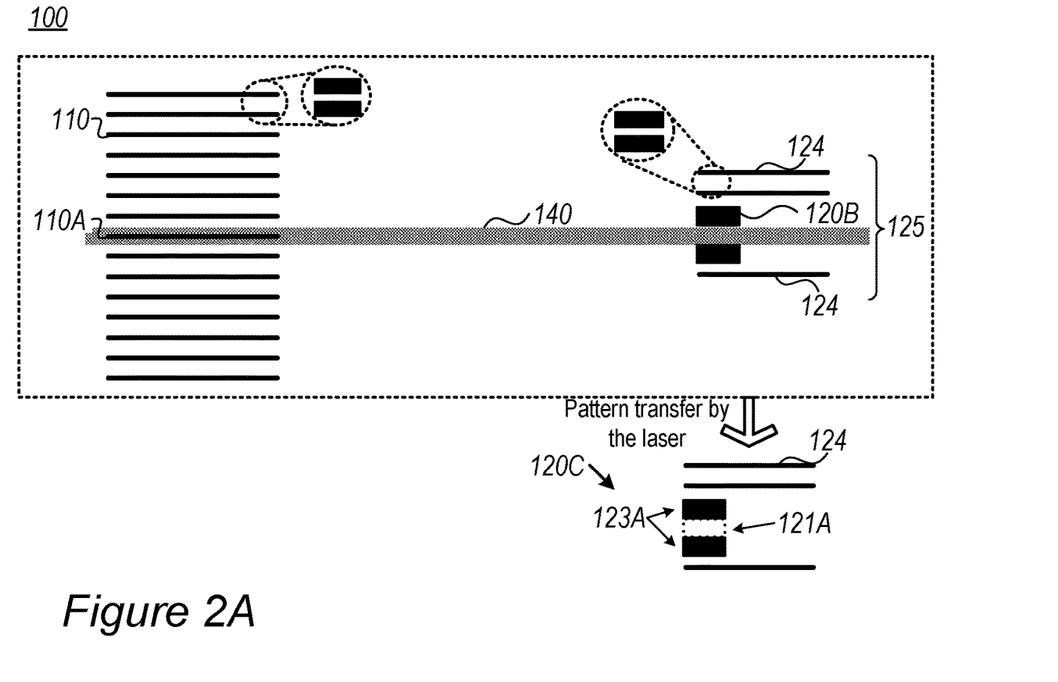
FIGS. 2A and 2B are high-level schematic illustrations of a pattern transfer sheet with trace marks for laser beam position measurements, according to some embodiments of the invention.
Figure 2B:
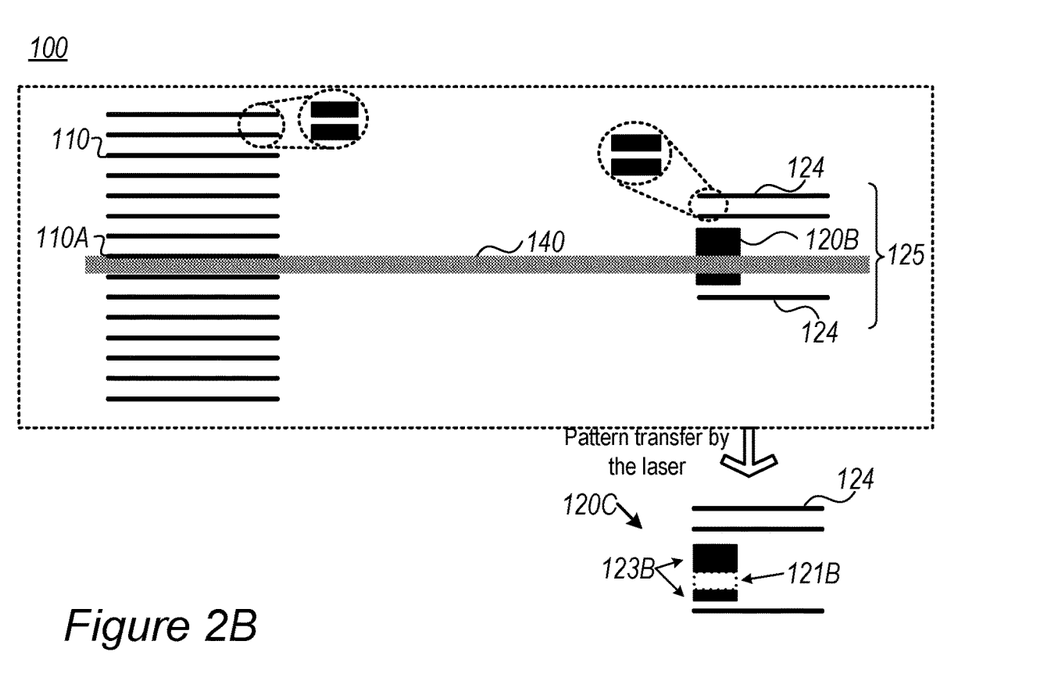

FIGS. 2A and 2B are high-level schematic illustrations of pattern transfer sheet 100 with trace marks 120 for laser beam position measurements, according to some embodiments of the invention. As trace marks 120 are aligned to specific trenches 110A and are wider than them, accurate laser beam positions remove paste from the centers of trace marks 120—leaving behind symmetric traces of remaining paste; while inaccurate laser beam positions remove paste off the centers of trace marks 120—leaving behind asymmetric traces of remaining paste.

FIG. 2A schematically represents an accurate alignment of laser beam 140 to trench 110A and respectively a central position of laser beam 140 with respect to filled trace mark 120B. Specifically, the remaining trace includes paste 123A on either side of a gap 121A that correspond to the paste removed from mark 120B by laser beam 140. Remaining paste trace 120C is symmetric and indicates the accurate alignment of laser beam 140.

FIG. 2B schematically represents an inaccurate alignment of laser beam 140 to trench 110A and respectively an eccentric position of laser beam 140 with respect to filled trace mark 120B. Specifically, the remaining trace includes paste 123B on either side of a gap 121B that correspond to the paste removed from mark 120B by laser beam 140. Remaining paste trace 120C is asymmetric and indicates the misalignment of laser beam 140.

Following paste deposition, paste trace 120C may be measured by a corresponding PTP system 150 (see, e.g., FIG. 5A) are used to readjust the laser beam position in the next paste transfer cycle, e.g., in printing the next wafer, for example by applying a calculated offset (related to the asymmetry in paste trace 120C to the laser beam location).

Pattern transfer sheet 100 may comprise a plurality of trace marks 120, and a controller 180 in PTP system 150 (see, e.g., FIG. 5A) may be configured to derive the laser misalignment with respect to multiple respective trace marks 120, e.g., applying statistical methods to enhance the accuracy of the calculated misalignment.

Figure 3:
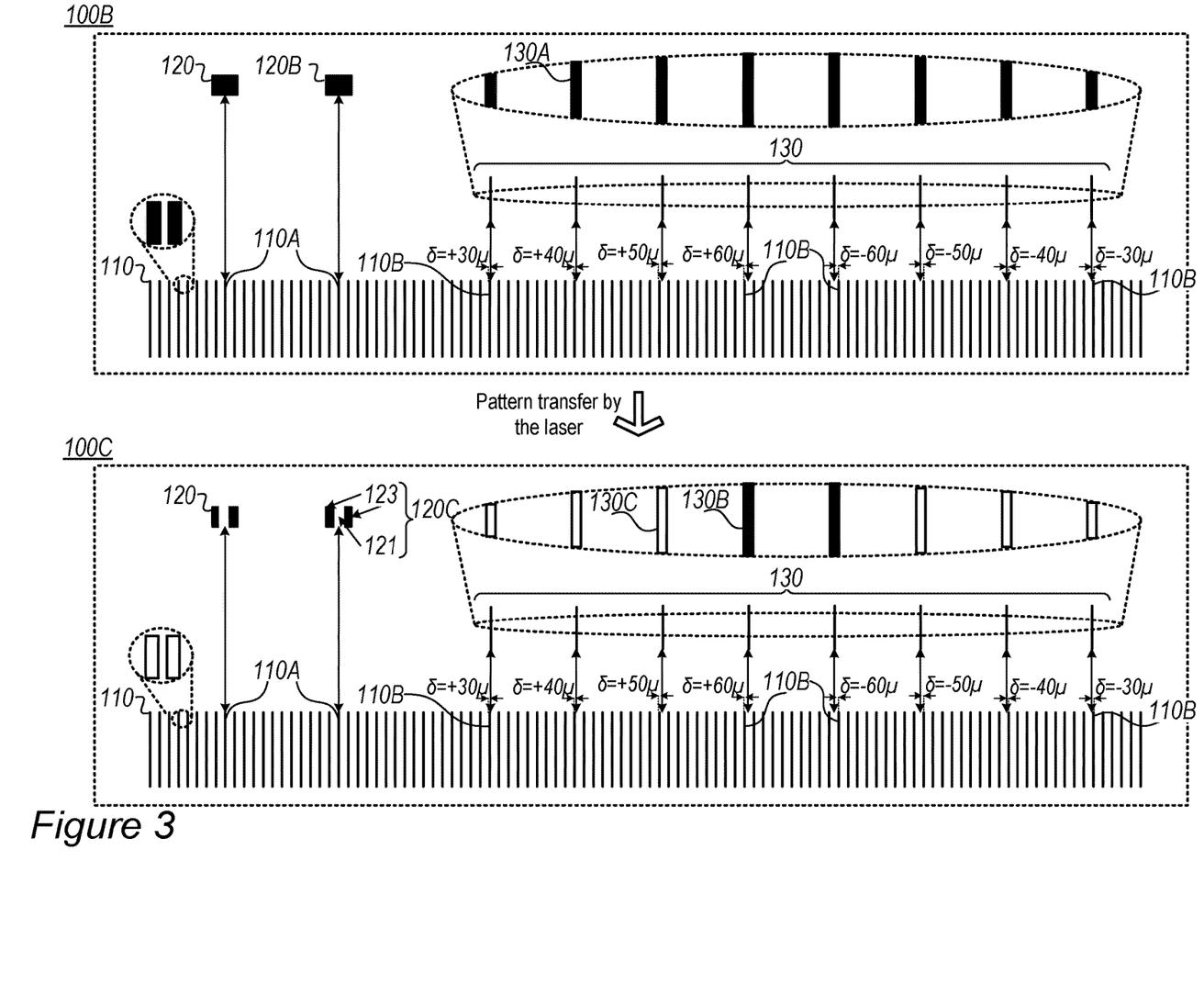
FIGS. 3 and 4 are high-level schematic illustrations of a pattern transfer sheet with trace marks and working window marks for monitoring the position and the power of the laser beam illumination, respectively, according to some embodiments of the invention.
Figure 4:
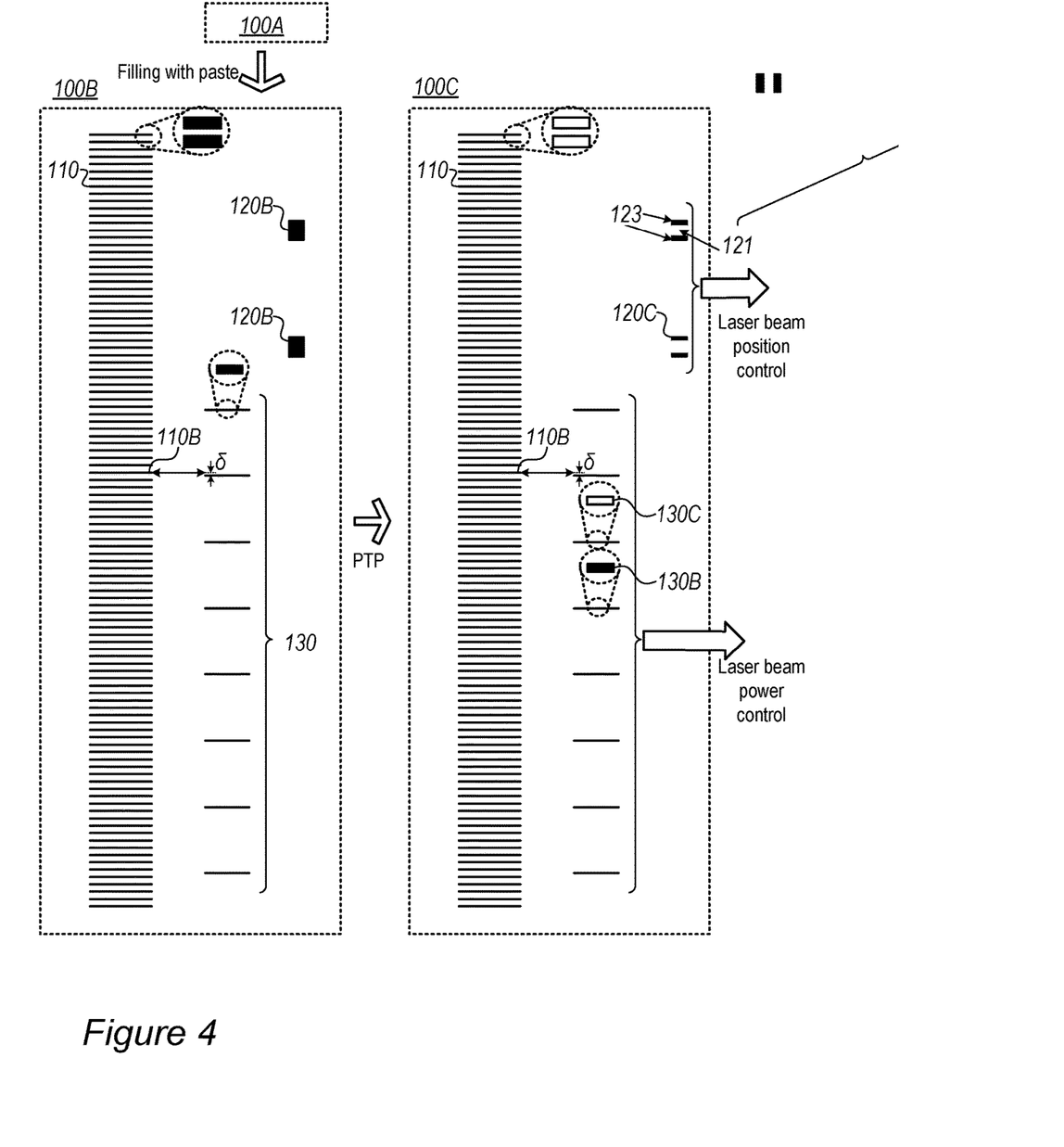

FIGS. 3 and 4 are high-level schematic illustrations of pattern transfer sheet 100 with trace marks 120 and working window marks 130 for monitoring the position and the power of the laser beam illumination, respectively, according to some embodiments of the invention. In FIG. 3, full and empty working window marks 130 are illustrated with enlarged details to elucidate the differences between marks 130A, 130B that are filled with paste and marks 130C that have been emptied from paste by laser beam 140 during the pattern transfer process.

Working window marks 130 are designed with specific offsets in which marks 130 are shifted with respect to specific trenches 110 on pattern transfer sheet 100. For example, in the schematic non-limiting illustration the shifts (offsets δ) range from −30 μm to −60 μm and from +30 μm to +60 μm, at 10 μm steps.

FIGS. 3 and 4 schematically illustrates pattern transfer sheet 100B with filled paste (prior to the laser illumination and paste deposition) and pattern transfer sheet 100C following the pattern transfer (with trenches 110 emptied from the filled paste by the laser illumination). Correspondingly, prior to the pattern transfer all working window marks 130A are filled with paste, while following the pattern transfer some working window marks 130C may be emptied while other working window marks 130B may remain filled with paste in case the laser beam did not illuminate them during the printing process.

As illustrated in the non-limiting example of FIG. 3, following the printing process, working window marks 130 shifted by offsets δ between −30 μm and −50 μm and between +30 μm and +50 μm were emptied by the laser illumination and became empty marks 130C, while marks 130 shifted by +60 μm and −60 μm offsets were not emptied by the laser illumination and remained full marks 130B. Image analysis may be applied to detect full working window marks 130B (which remain filled by paste after the pattern transfer process) and empty working window marks 130C (from which paste was removed during the pattern transfer process), and derive therefrom the effective working window depending on the laser power, as at the specified offsets the laser beam does not remove efficiently the paste from respective working window marks 130B (e.g., due to low effective power or other reasons). Therefore, the actual effective beam width (termed the working window) may be smaller than required and insufficient for compensating for the laser-to-trench alignment tolerance, causing partial or no deposition of the paste. For example, in the case illustrated in FIG. 3, laser power is effective only over an effective working window of 100 μm=50 μm+50 μm. Controller(s) 180 of PTP system 150 (described below) may be configured to control the working window, at least to some extent, by modifying the applied laser power: the higher the laser power, the wider the laser beam and so the greater is the working window.

FIG. 5A is a high-level schematic illustration of PTP system 150, according to some embodiments of the invention. Highly schematic FIG. 5A illustrates transfer of patterned paste from sheet 100 to substrate 90 using laser beam 140 by laser scanner(s) 160. One or more imaging unit(s) 170 may be configured to monitor the pattern transfer process optically, e.g., monitoring the transfer of the printing paste by emptying of trenches 110 and of marks 120, 130 onto the substrate, as explained herein. One or more controllers 180 may be in communication with laser scanner(s) 160 and imaging unit(s) 170 and be configured to adjust optical parameters of laser beam 140 by modifying the settings of power and position of laser scanner(s) 160 according to image analysis of images taken by imaging unit(s) 170. For example, controller 180 may be configured to calculate an alignment of laser beam 140 according to paste traces 120C (illustrated in FIGS. 2A, 2B and 3) on pattern transfer sheet 100. Controller 180 may be further configured to detect misalignment of laser scanner 160 upon detection of asymmetric paste trace(s) 120C (see, e.g., FIG. 2B). Controller 180 may be further configured to calculate an effective working window of laser beam 140 using remaining working window marks 130 on pattern transfer sheet 100 and adjust laser power of the laser scanner 160 accordingly. Additional non-limiting details for PTP system are provided, e.g., in U.S. Pat. No. 9,616,524.

Disclosed systems 150 and sheets 100 may be used to print fine lines 165 of thick metallic paste to produce electronic circuits, e.g., creating conductive lines or pads or other features on laminates for PCBs or other printed electronic boards, or on silicon wafers, e.g., for photovoltaic (PV) cells. Other applications may comprise creating conductive features in the manufacturing processes of mobile phones antennas, decorative and functional automotive glasses, semiconductor integrated circuits (IC), semiconductor IC packaging connections, printed circuit boards (PCB), PCB components assembly, optical biological, chemical and environment sensors and detectors, radio frequency identification (RFID) antennas, organic light-emitting diode (OLED) displays (passive or active matrix), OLED illuminations sheets, printed batteries and other applications. For example, in non-limiting solar applications, the metallic paste may comprise metal powder(s), optional glass frits and modifier(s), volatile solvent(s) and non-volatile polymer(s) and/or or resin(s). A non-limiting example for the paste includes SOL9651B™ from Heraeus™.

Filling of the paste into trenches 110, trace marks 120 and working window marks 130 may be carried out by any type of paste-filling head operating within any type of PTP system. The filling process may be controlled to assure continuous and uniform filling of the trenches and marks with paste.

Figure 5B:
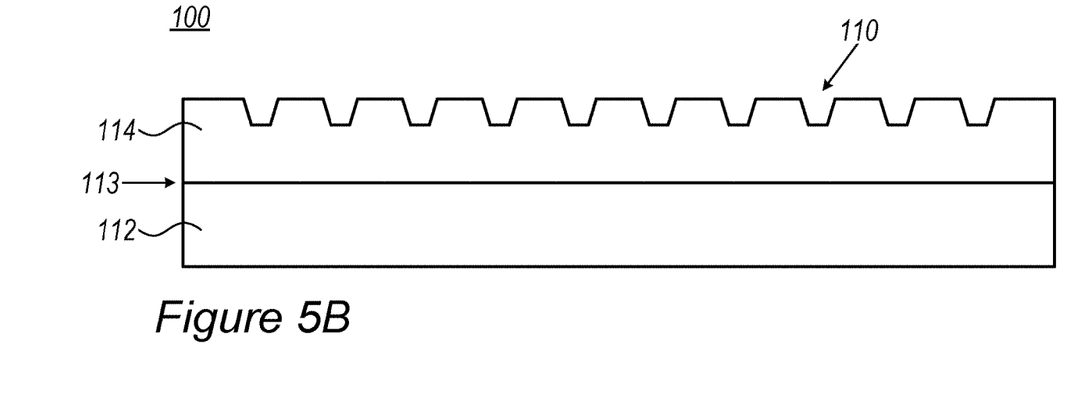
FIG. 5B is a high-level schematic cross section illustration of a pattern transfer sheet, according to some embodiments of the invention.

FIG. 5B is a high-level schematic cross section illustration of pattern transfer sheet 100, according to some embodiments of the invention.

In certain embodiments, pattern transfer sheet 100 may be transparent to laser beam 140 and comprise at least a top polymer layer 114 comprising trenches 110 and marks 120, 130 (illustrated in FIGS. 1A through 5A) embossed, press molded, pneumatically molded or laser molded thereon. In the illustrated non-limiting example, trenches 110 are illustrated as being trapezoid in cross section.

It is noted that while schematic FIG. 5B shows periodical trenches 110, marks 120 and/or 130 (illustrated in FIGS. 1A through 5A) may comprise trenches, recesses and/or indentations that are embossed (e.g., press molded, pneumatically molded or laser molded) in a similar manner into top polymer layer 114, and may have similar or different profiles. For example, trenches 110, trace marks 120 and/or working window marks 130, and alignment marks 124 may have various profiles (cross section shapes), such as trapezoid, rounded, square, rectangular and/or triangular profiles. In various embodiments, the pattern of trenches 110 on transfer sheet 100 may comprise continuous trenches 110 and/or arrays of separated dents. It is noted that the term "trenches" is not to be construed as limiting the shape of trenches 110 to linear elements, but is understood in a broad sense to include any shape of trenches 110.

Pattern transfer sheet 100 may further comprise a bottom polymer layer 112 having a melting temperature that is higher than an embossing temperature of top polymer layer 114. In a non-limiting example, top polymer layer 114 may have a melting temperature ($T_m$) below 170° C., below 150° C., below 130° C., below 110° C. (or any intermediate range) in case it is made of semi-crystalline polymer, or a glass temperature ($T_g$) below 160° C., below 140° C., below 120° C., below 100° C. (or any intermediate range) in case it is made of amorphous polymer. The melting temperature of bottom polymer layer 112 may be above the melting point of top polymer layer 114, e.g., above 100° C. (e.g., in case top polymer layer 114 is made of polycaprolactone and has $T_m/T_g$ about 70° C.), above 120° C., above 150° C., above 160° C. (e.g., bi-axially-oriented polypropylene) and up to 400° C. (e.g., certain polyimides), or intermediate values.

In various embodiments, polymer layers 112, 114 may be made of at least one of: polyethylene, polypropylene, polyethylene terephthalate, polybutylene terephthalate, polyethylene naphthalate, fully aromatic polyester, other copolymer polyester, polymethyl methacrylate, other copolymer acrylate, polycarbonate, polyamide, polysulfone, polyether sulfone, polyether ketone, polyamideimide, polyether imide, aromatic polyimide, alicyclic polyimide, fluorinated polyimide, cellulose acetate, cellulose nitrate, aromatic polyamide, polyvinyl chloride, polyphenol, polyarylate, polyphenylene sulfide, polyphenylene oxide, polystyrene, or combinations thereof—as long as top polymer layer 114 has a melting or glass transition temperature ($T_m/T_g$) below the melting or glass transition temperature ($T_m/T_g$) of bottom polymer layer 112 and/or as long as bottom polymer layer 112 is not affected by the processing conditions of top polymer layer 114.

In certain embodiments, the bottom polymer layer 112 and the top polymer layer 114 may be each between 10 μm and 100 μm thick, e.g., between 15 μm and 80 μm thick, between 20 μm and 60 μm thick, between 25 μm and 40 μm thick, or within any intermediate range, with bottom polymer layer 112 being at least as thick as top polymer layer 114. The bottom polymer layer 112 and the top polymer layer 114 may be attached by an adhesive layer 113 thinner than 10 μm (e.g., thinner than 8 μm, thinner than 6 μm, thinner than 4 μm, thinner than 2 μm or having any intermediate thickness), that is transparent to laser beam 140. For example, in certain embodiments, top polymer layer 114 may be thicker than the depth of trenches 110 (and/or marks 120 and/or 130) by several μm, e.g., by 5 μm, by 3-7 μm, by 1-9 μm, or by up to 10 μm. For example, trenches 110 may be 20 μm deep, top polymer layer 114 may be between 20-30 μm thick (e.g., 25 μm thick) and bottom polymer layer 112 may range in thickness between 15 μm and 35 μm (it is noted that thicker bottom polymer layers 112 provide better mechanical performances).

The temperature and thickness of top polymer layer 114 and bottom polymer layer 112 may be designed so that top polymer layer 114 has good molding, ductility and certain mechanical strength, while bottom polymer layer 112 has good mechanical strength. Both top polymer layer 114 and bottom polymer layer 112 may be designed to have good bonding properties.

Elements from FIGS. 1A, 1B, 2A, 2B, 3, 4, 5A and 5B may be combined in any operable combination, and the illustration of certain elements in certain figures and not in others merely serves an explanatory purpose and is non-limiting. It is noted that disclosed values may be modified by at least ±10% of the respective values.

Figure 6:
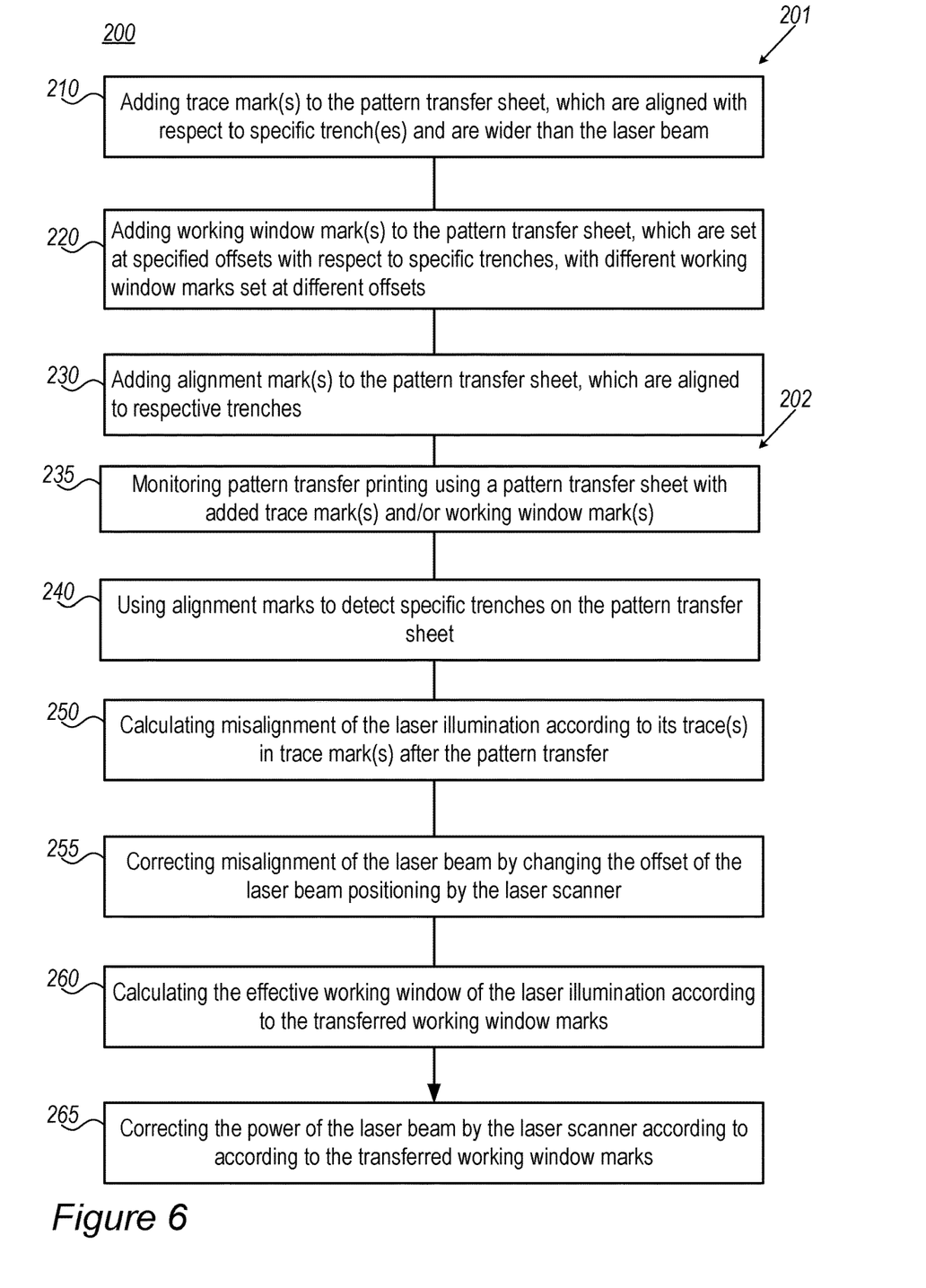
FIG. 6 is a high-level flowchart illustrating a method of monitoring pattern transfer printing, according to some embodiments of the invention.

FIG. 6 is a high-level flowchart illustrating a method 200 of monitoring pattern transfer printing, according to some embodiments of the invention. The method stages may be carried out using pattern transfer sheet(s) 100 and/or with respect to PTP systems 150 described above, which may optionally be configured to implement method 200. Method 200 may be at least partially implemented by at least one computer processor, e.g., in a PTP system. Certain embodiments comprise computer program products comprising a computer readable storage medium having computer readable program embodied therewith and configured to carry out the relevant stages of method 200. Method 200 may comprise the following stages, irrespective of their order.

Method 200 may comprise monitoring pattern transfer printing using a pattern transfer sheet with added trace mark(s) and/or working window mark(s) (stage 235). In some embodiments, method 200 may comprise designing and/or producing the pattern transfer sheet(s) (stages denoted by 201), e.g., in a sheet embossing process, and/or using the pattern transfer sheet(s) for monitoring the pattern transfer 235 (stages denoted by 202). The pattern transfer sheet may comprise multiple trenches arranged in a specified pattern and configured to receive printing paste and release the printing paste from the trenches onto a receiving substrate upon illumination by a laser beam.

Method 200 may comprise adding to the pattern transfer sheet at least one trace mark that is located outside the specified pattern and is configured to receive the printing paste (stage 210), wherein the at least one trace mark is aligned with respect to at least one of the trenches and is wider than a width of the laser beam, and calculating misalignment of the laser beam according to at least one trace thereof in the at least one trace mark after the pattern transfer (stage 250) and correcting the calculated misalignment of the laser beam by adjusting a positioning of the laser beam by the laser scanner (stage 255), e.g., to reach correct alignment.

Method 200 may comprise adding to the pattern transfer sheet a plurality of working window marks that are located outside the specified pattern and are configured to receive the printing paste (stage 220), wherein the working window marks are set at specified offsets with respect to specified trenches of the specified pattern, and wherein different working window marks are set at different offsets, and calculating an actual effective working window of the laser beam according to transferred working window marks after the pattern transfer (stage 260) and correcting the effective working window by adjusting a power of the laser beam (stage 265), e.g., to maintain a pre-defined working window.

In certain embodiments, method 200 further comprises adding alignment mark(s) to the pattern transfer sheet, which are aligned to respective trenches (stage 230) and using the alignment marks to detect specific trenches on the pattern transfer sheet (stage 240).

Since the budget of tolerances for the laser beam to trench pattern alignment is very strict and the process working window for qualitative printing (depending mainly on the paste condition) is relatively small, any changes in the ambient or internal conditions in the modules might cause deterioration of the printing quality. Advantageously, disclosed systems 150 and methods 200, using pattern transfer sheet(s) 100 overcome the challenge of monitoring and of correcting (if needed) the position and the power of the laser illumination to properly release metal paste from the polymer substrate. Specifically, in various embodiments, the trace mark(s) are used to optically monitor and calculate a misalignment of the laser beam and to enable correcting the calculated misalignment of the laser beam by adjusting a positioning of the laser beam; and/or in various embodiments, the working window marks are used to optically monitor and calculate the actual effective working window of the printing process and to correct the effective working window by adjusting a power of the laser beam.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

The invention claimed is:

1. A pattern transfer sheet comprising:
a plurality of trenches arranged in a specified pattern and configured to receive printing paste and release the printing paste from the trenches upon illumination by a laser beam onto a receiving substrate,
wherein the pattern transfer sheet comprises at least one of:
(i) at least one trace mark that is located outside the specified pattern and is configured to receive the printing paste, wherein the at least one trace mark is aligned with respect to at least one of the trenches and is wider than a width of the laser beam; and
(ii) a plurality of working window marks that are located outside the specified pattern and are configured to receive the printing paste, wherein the working window marks are set at specified offsets with respect to specified trenches of the specified pattern and wherein different working window marks are set at different offsets.

2. The pattern transfer sheet of claim 1, wherein the pattern transfer sheet comprises the at least one trace mark.

3. The pattern transfer sheet of claim 1, wherein the pattern transfer sheet comprises the plurality of working window marks.

4. The pattern transfer sheet of claim 1, wherein the pattern transfer sheet further comprises a plurality of alignment marks that are located outside the specified pattern and are configured to receive the printing paste, wherein the alignment marks are aligned with respective trenches.

5. The pattern transfer sheet of claim 4, wherein the alignment marks are arranged in an asymmetric pattern.

6. The pattern transfer sheet of claim 1, wherein the pattern transfer sheet is transparent to the laser illumination, and the trenches are formed into the pattern transfer sheet by press molding, pneumatic molding, laser molding or embossing.

7. The pattern transfer sheet of claim 1, wherein a cross section of the trenches is any of: trapezoid, square, rectangular, rounded or triangular.

8. The pattern transfer sheet of claim 1, wherein the pattern transfer sheet comprises at least one polymer layer which is made of at least one of: polyethylene, polypropylene, polyethylene terephthalate, polybutylene terephthalate, polyethylene naphthalate, fully aromatic polyester, other copolymer polyester, polymethyl methacrylate, other copolymer acrylate, polycarbonate, polyamide, polysulfone, polyether sulfone, polyether ketone, polyamideimide, polyether imide, aromatic polyimide, alicyclic polyimide, fluorinated polyimide, cellulose acetate, cellulose nitrate, aromatic polyamide, polyvinyl chloride, polyphenol, polyarylate, polyphenylene sulfide, polyphenylene oxide, polystyrene, or combinations thereof.

9. The pattern transfer sheet of claim 1, wherein the pattern transfer sheet is configured to be transparent to laser illumination and comprises at least one polymer layer, and wherein the at least one trace mark is set on the polymer layer.

10. The pattern transfer sheet of claim 9, wherein the pattern transfer sheet comprises at least:
a top polymer layer comprising the trenches and at least one trace mark embossed thereon, and
a bottom polymer layer having a melting temperature that is higher than an embossing temperature of the top polymer layer.

11. The pattern transfer sheet of claim 10, wherein the top polymer layer has a melting temperature below 170° C. in case it is made of semi-crystalline polymer, or a glass temperature below 160° C. in case it is made of amorphous polymer.

12. The pattern transfer sheet of claim 10, wherein the top polymer layer has a melting temperature below 110° C. in case it is made of semi-crystalline polymer, or a glass temperature below 100° C. in case it is made of amorphous polymer.

13. The pattern transfer sheet of claim 10, wherein the top polymer layer and the bottom polymer layer are each between 10 µm and 100 µm thick, are attached by an adhesive layer thinner than 10 µm that is transparent to the laser illumination, and wherein the bottom polymer layer is at least as thick as the top polymer layer.

14. The pattern transfer sheet of claim 10, wherein the top polymer layer and the bottom polymer layer are each between 25 µm and 40 µm thick, are attached by an adhesive layer thinner than 2 µm that is transparent to the laser illumination, and wherein the bottom polymer layer is at least as thick as the top polymer layer.

* * * * *